(12) United States Patent
Yi et al.

(10) Patent No.: US 10,791,637 B2
(45) Date of Patent: Sep. 29, 2020

(54) CIRCUIT BOARD SECURE CONNECTION APPARATUS, CIRCUIT BOARD AND PLUG-AND-LOCK INDUSTRIAL COMPUTER FRAME

(71) Applicants: Lixing Yi, Hunan (CN); Yipin Chen, Hunan (CN)

(72) Inventors: Lixing Yi, Hunan (CN); Yipin Chen, Hunan (CN)

( * ) Notice: Subject to any disclaimer, the term of this patent is extended or adjusted under 35 U.S.C. 154(b) by 0 days.

(21) Appl. No.: 15/321,784

(22) PCT Filed: Jun. 18, 2015

(86) PCT No.: PCT/CN2015/081811
§ 371 (c)(1),
(2) Date: Dec. 23, 2016

(87) PCT Pub. No.: WO2015/196945
PCT Pub. Date: Dec. 30, 2015

(65) Prior Publication Data
US 2017/0142849 A1    May 18, 2017

(30) Foreign Application Priority Data
Jun. 24, 2014    (CN) .......................... 2014 1 0285445

(51) Int. Cl.
*H05K 7/12* (2006.01)
*H05K 5/00* (2006.01)
(Continued)

(52) U.S. Cl.
CPC ......... *H05K 5/0043* (2013.01); *H05K 5/0069* (2013.01); *H05K 5/0226* (2013.01); *H05K 7/12* (2013.01); *H05K 7/1409* (2013.01)

(58) Field of Classification Search
CPC .................................................. H05K 5/0043
(Continued)

(56) References Cited

U.S. PATENT DOCUMENTS 4,614,457 A * 9/1986 Sammon ............. B25B 23/0014
403/322.2
6,961,249 B2 * 11/2005 Wong .................... H05K 7/1409
361/754
(Continued)

FOREIGN PATENT DOCUMENTS

CN        2906982    *  5/2007  ........... H01R 13/629

*Primary Examiner* — Stanley Tso
(74) *Attorney, Agent, or Firm* — Lei Yu(Patent Attorney)

(57) ABSTRACT

A circuit board secure connection apparatus, a circuit board and a plug-and-lock industrial computer frame are provided. The circuit board secure connection apparatus includes: a holder; a connector which is elastic and movably mounted on the holder; a profile ratchet which is elastic and hinged on a bottom portion of the holder through a first hinge; a hook handle hinged on a rear portion of the holder through a second hinge; and a hook button which is elastic and movably mounted on the hook handle; wherein the hook handle cooperates with the holder through the hook button for being attached to or detached from the holder; the hood handle cooperates with the profile ratchet for rotating the profile ratchet. The plug-and-lock industrial computer frame with the circuit board secure connection apparatus and the circuit board has advantages such as simple installation, reliable connection, and sufficient performance.

4 Claims, 6 Drawing Sheets

(51) Int. Cl.
*H05K 7/14* (2006.01)
*H05K 5/02* (2006.01)

(58) Field of Classification Search
USPC .......................................................... 361/759
See application file for complete search history.

(56) References Cited

U.S. PATENT DOCUMENTS

| | | | | |
|---|---|---|---|---|
| 7,027,309 B2 * | 4/2006 | Franz | ............... | H01R 13/62933 |
| | | | | 361/732 |
| 2006/0163883 A1 * | 7/2006 | Hoshikawa | ............. | E05B 83/36 |
| | | | | 292/216 |

* cited by examiner

A—A

B—B

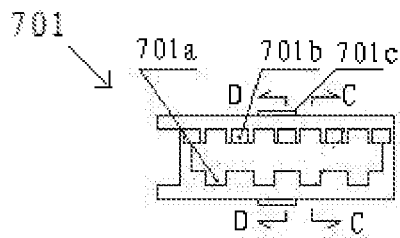
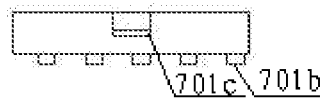
Fig. 10    Fig. 11    Fig. 12    Fig. 13
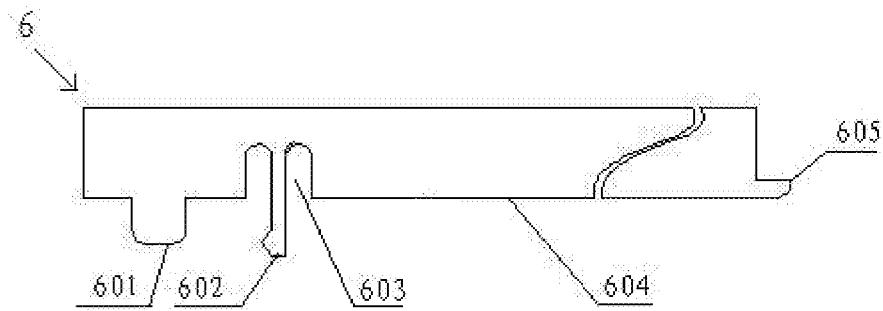
Fig. 14
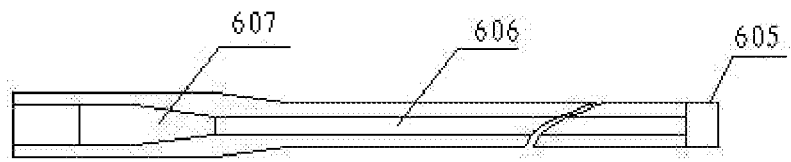
Fig. 15
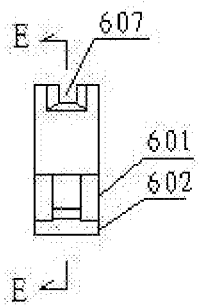
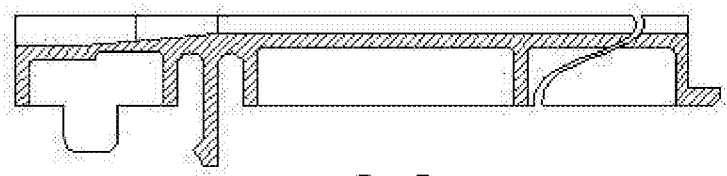
Fig. 16    Fig. 17

CIRCUIT BOARD SECURE CONNECTION APPARATUS, CIRCUIT BOARD AND PLUG-AND-LOCK INDUSTRIAL COMPUTER FRAME

CROSS REFERENCE OF RELATED APPLICATION

This is a U.S. National Stage under 35 U.S.C. 371 of the International Application PCT/CN2015/081811, filed Jun. 18, 2015, which claims priority under 35 U.S.C. 119(a-d) to CN 2014102854459, filed Jun. 24, 2014.

BACKGROUND OF THE PRESENT INVENTION

Field of Invention

The present invention relates to an industrial computer structure, and more particularly to a circuit board secure connection apparatus, a circuit board and a plug-and-lock industrial computer frame.

Description of Related Arts

Computer control is widely applied in industrial equipment, electrical equipment, etc. Industrial computers generally use a bus structure, with a lot of cables, screws and nuts. Conventional bus type industrial computer is shown in FIG. 21, including a frame 007; and a computer bus board 010 mounted on the frame 007, having several sockets 008; wherein the computer bus board 010 cooperates with a nut 006 on a crossbeam 005 of the frame 007 via a screw 011, so as to be mounted on the frame 007; a circuit board 004 with a plurality of plugs 009 is inserted into corresponding sockets 008 for connecting the computer bus board 010, so as to form an intelligent protection and monitoring terminal of the bus type industrial computer. In order to ensure connection between the circuit board 004 and the sockets 008, the circuit board 004 cooperates with a nut 002 on the crossbeam 005 of the frame 007 via a screw 001, so as to be mounted on the frame 007. According to the above conventional industrial computer device, structural problems exist, including that: firstly, it is impossible to guarantee that all the circuit board 004 and the sockets 008 are sufficiently connected, which means poor connection consistency and reliability; secondly, for installing the circuit board 004, the screw 001 must be aimed at the nut 002 on the frame before tightening, and for uninstalling the circuit board 004, the screw 001 must be loosened before pulling out the circuit board 004 with a pulling handle 003 mounted thereon, which is complex, time-consuming, and tiring; thirdly, interchangeability is poor, which is impossible to satisfy interchangeable and generic requirements.

SUMMARY OF THE PRESENT INVENTION

An object of the present invention is to provide a circuit board secure connection apparatus, a circuit board and a plug-and-lock industrial computer frame with simple installation, reliable connection, and sufficient performance.

In order to achieve the above object, the present invention provides:

a circuit board secure connection apparatus, comprising: a holder; a connector which is elastic and movably mounted on the holder; a profile ratchet which is elastic and hinged on a bottom portion of the holder through a first hinge; a hook handle hinged on a rear portion of the holder through a second hinge; and a hook button which is elastic and movably mounted on the hook handle; wherein the hook handle cooperates with the holder through the hook button for being attached to or detached from the holder; the hood handle cooperates with the profile ratchet for rotating the profile ratchet.

A plug and a buckle are provided on the holder; a hook on the hook button cooperates with the buckle on the holder, or two hooks on the hook button respectively cooperate with the buckle on the holder and the second hinge.

A convex portion and a toggle are mounted on the hook handle; ratchet teeth and a transmission block are provided on the profile ratchet; the hook handle cooperates with the transmission block of the profile ratchet through the toggle.

The connector is sleeved on the holder with an interval, an elastic part is provided between the holder and the connector.

A circuit board comprises: a main body with a body plug; wherein the circuit board secure connection apparatus is provided on the main body, and is mounted on the main body through a connector.

The circuit board secure connection apparatus is symmetrically provided on a rear portion of the main body.

A plug-and-lock industrial computer frame, comprises: a box; and a crossbeam mounted on the box for mounting the circuit board; wherein the circuit board cooperates with the crossbeam through a profile ratchet in a circuit board secure connection apparatus for being attached to or detached from the crossbeam.

Rails corresponding to a main body of the circuit board are respectively provided on the crossbeam;

rail holders are respectively provided on the crossbeam, wherein the crossbeam cooperates with the rails through the rail holders;

each of the rail holders is formed by multiple rail holder units embedded in the crossbeam, and the rail holder units are inserting holes and limiting convex parts which are arranged alternatively and cooperate with the rails;

a positioning slot cooperating with the main body of the circuit board is provided on a first face of each of the rails; a rail plug and a rail hock are provided on a second face of each of the rails; wherein the rails respectively cooperate with the inserting holes on the rail holder units through the rail plug and the rail hock, so as to be buckled and limited by the crossbeam.

The crossbeam comprises a middle crossbeam part and a rear crossbeam part, wherein a buckle, a flange and a limiting slot cooperating with a plug of the circuit board secure connection apparatus, a convex part of a hook handle and ratchet teeth of the profile ratchet are provided on the crossbeam.

Elastic contact-fixing devices are symmetrically provided on both sides of the front portion of the box.

The box comprises a hanging fixer on a front portion of the box, which is frame-shaped; and side boards provided at both sides of the hanging fixer; wherein the middle crossbeam part and the rear crossbeam part are respectively mounted on the side boards.

The present invention overcomes the problems of the prior art. In a conventional industrial computer, it is impossible to guarantee sufficient connection between a circuit board and sockets, and reasons thereof are as follows. Firstly, the circuit board is connected to the industrial computer through screws, wherein the more the circuit board is, the more the screws will be. Screw threads on the screws are small, so it is impossible to ensure that all screws are coaxial with nuts on the industrial during installation, leading to damages of the screws of the circuit board and the nut of the industrial nut, wherein the nuts of the industrial computer are hard to replace or repair, which lowers an overall security of the apparatus. Secondly, a connection method of the screws has a huge impact on the circuit board. An interval between the circuit boards is quite small, so shift of the screws and the nuts will squeeze adjacent modules, which is not suitable for features such as being standard and replaceable. Thirdly, a total length of the circuit board fails to satisfy a total length requirement of the industrial computer, which is caused by an accumulated error of plug, screws, installing aperture of the circuit board, processing, and assembling factors, as well as an accumulated error formed between the nuts and the sockets of the industrial computer. Referring to FIG. 21, since all parts of the circuit board and the industrial computer will generate the accumulated error during manufacturing and assembling, the accumulated error focuses on part h and part h1, leading to two results: 1) excessive positive error deforms the circuit board when tightening with a harmful force; 2) excessive negative error decreases a contacting area between the plug and the socket, reducing product reliability and stability.

According to the present invention, conventional screw connection is no longer adapted for connecting the circuit board and the frame, wherein the profile ratchet of the circuit board secure connection apparatus is used for movably connecting the frame. Due to elastic interval connection between the connector connecting the circuit board in the circuit board secure connection apparatus and the holder, the connection is a flexible connection. Therefore, the positive and negative errors between the circuit board and the frame are transformed to a shift in the circuit board secure connection apparatus. Without the screws and the nuts, deformation threat is eliminated, so the plug contact is completely reliable. Furthermore, a plug-and-lock feature is enabled, which is simple, reliable and safe.

According to the present invention, the circuit board is connected to the crossbeam of the frame through the circuit board secure connection apparatus with no compression, sufficient compatibility and sufficient interchangeability, which is conducive to product maintenance, production and management.

During installation of the plug-and-lock industrial computer frame of the present invention, due to use of the hanging fixer and the elastic contact-fixing devices for mounting the box on a cabinet, the industrial computer frame box is able to be rapidly attached to or detached from the cabinet, which simplifies debugging, maintenance, and replacement.

Referring to drawings, the present invention will be further illustrated.

BRIEF DESCRIPTION OF THE DRAWINGS

FIG. 10 is a sketch view of a rail holder unit of the present invention.
FIG. 11 is a CC sectional view of FIG. 10.
FIG. 12 is a DD sectional view of FIG. 10.
FIG. 13 is a top view of FIG. 10.
FIG. 14 is a sketch view of a rail of the present invention.
FIG. 15 is a top view of FIG. 14
FIG. 16 is a left view of FIG. 14.
FIG. 17 is an EE sectional view of FIG. 16.

DETAILED DESCRIPTION OF THE PREFERRED EMBODIMENT

Figure 1:
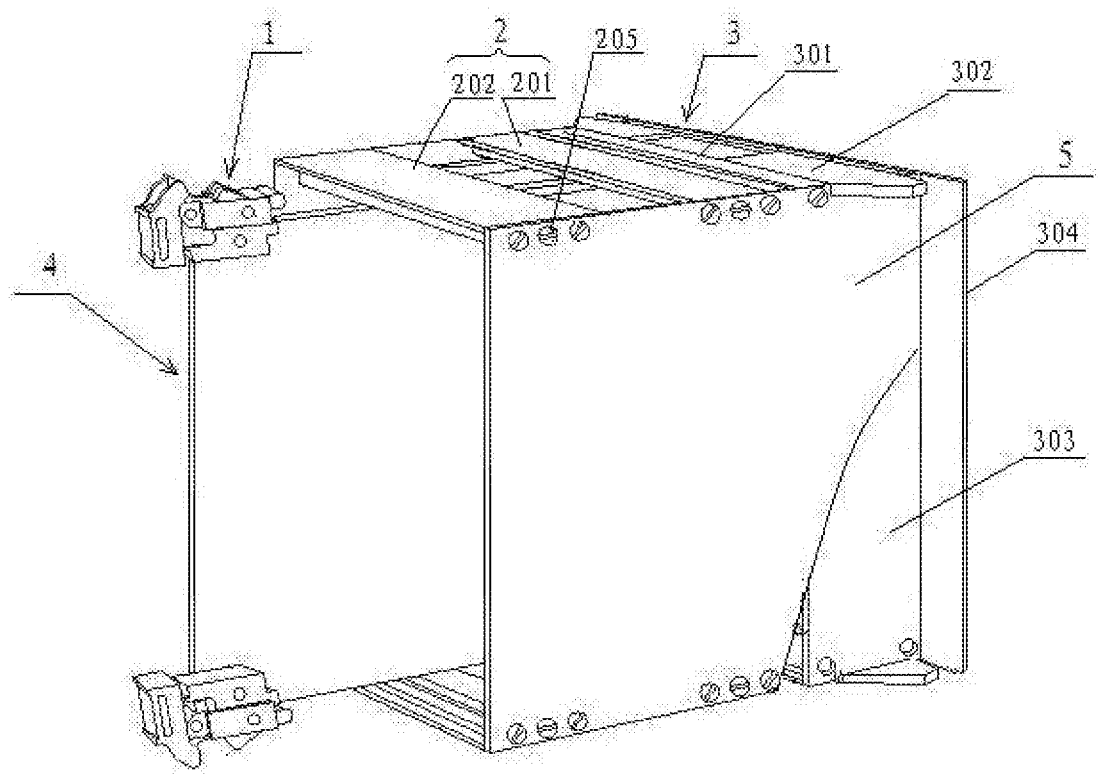
FIG. 1 is a perspective view of the present invention.
Figure 2:
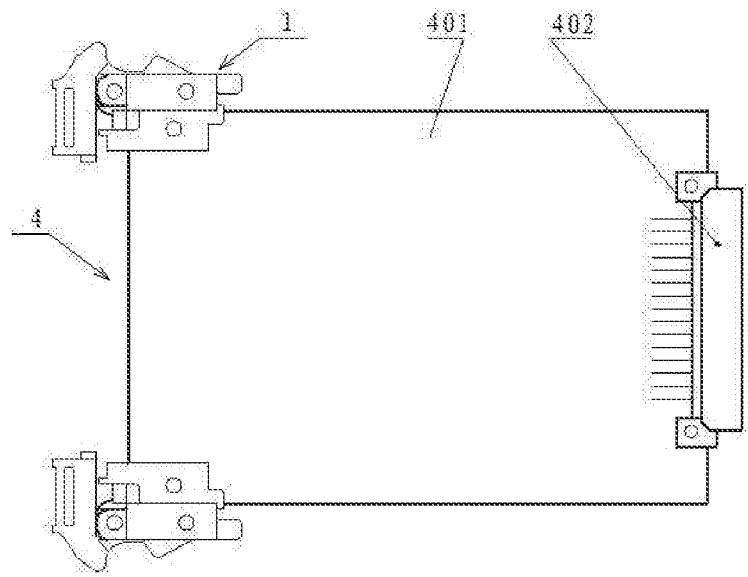
FIG. 2 is a sketch view of a circuit board of the present invention.
Figure 3:
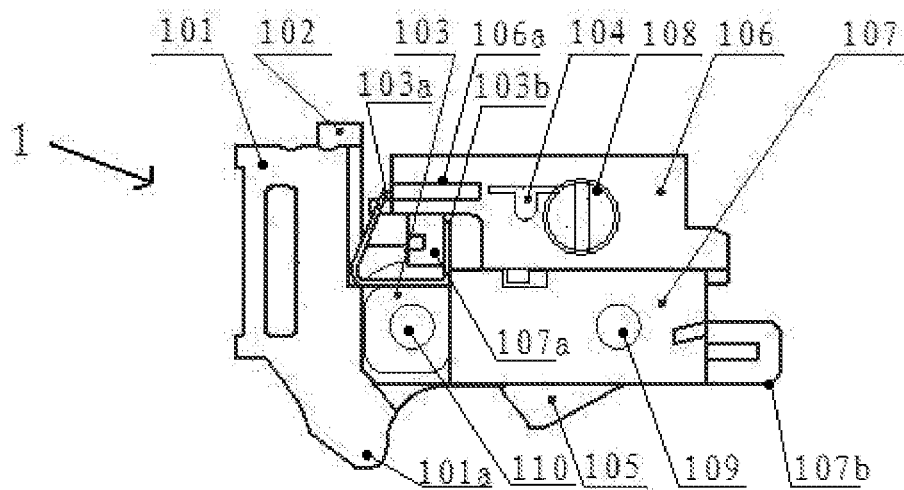
FIG. 3 is a sketch view of a circuit board secure connection apparatus of the circuit board.
Figure 4:
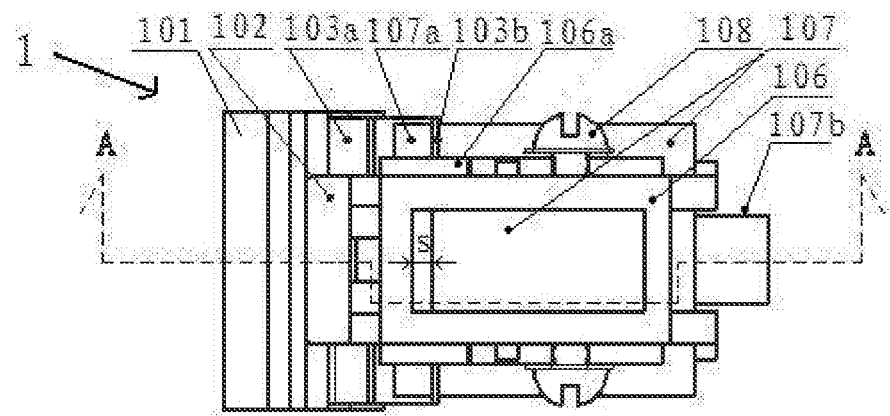
FIG. 4 is a top view of FIG. 3.
Figure 5:
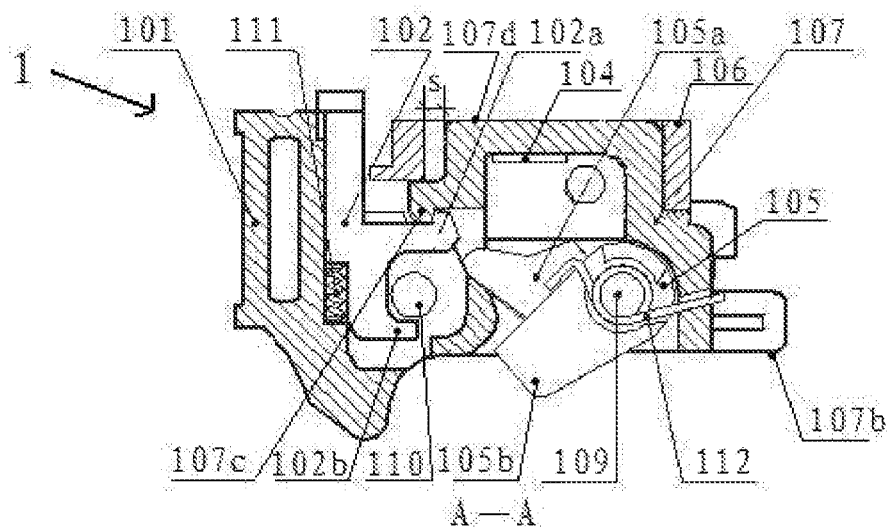
FIG. 5 is an AA sectional view of FIG. 4.
Figure 6:
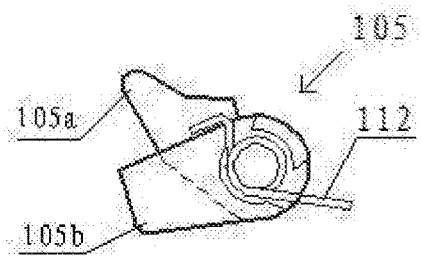
FIG. 6 is a sketch view of a profile ratchet of the circuit board secure connection apparatus.
Figure 7:
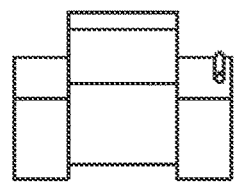
FIG. 7 is a left view of FIG. 6.

Referring to FIG. 1, a plug-and-lock industrial computer frame of the present invention is provided, comprising: a box, wherein multiple circuit boards 4 are arranged in the box in parallel; the box is formed by a frame-shaped hanging fixer 3 provided at a front portion of the box, side boards 5 provided at both sides of the frame-shaped hanging fixer 3, and a crossbeam 2 provided between the side boards 5 for fixing the circuit boards 4; the frame-shaped hanging fixer 3 (see FIG. 18) comprises a frame, formed by left and right side boards 303 and front crossbeam part 301, and a flange 304 provided at a front portion of the frame; elastic contact-fixing devices 302 are symmetrically provided at both sides of the front crossbeam part 301; the side boards 5 of the box are mounted on the crossbeam 2 and the front crossbeam part 301 of the hanging fixer 3 through a screw bolt 205; each of the circuit boards 4 (see FIG. 2) comprises a body plug 402 and a main body 401, wherein a circuit board secure connection apparatus is symmetrically provided on a rear portion of the main body 401.

Referring to FIGS. 3-7, the circuit board secure connection apparatus 1 comprises: a holder 107, a connector 106, a profile ratchet 105, a hook handle 101, and a hook button 102; wherein the holder 107 has an interlayer structure; a top portion thereof is an inverted U-shaped portion 107d, a plug 107b is provided at a front end of a bottom portion, convex blocks 107a are provided at both sides at a middle portion of a rear end; the rear end has an opening, a buckle 107c is provided at a top edge of the opening; an acute-angled ratchet teeth 105b and a transmission block 105a are provided on the profile ratchet 105, the profile ratchet 105 and a reset spring 112 are hinged to a front interlayer of the holder 107 through a first pin 109, and the ratchet teeth 105b is exposed from the bottom portion of the holder 107; a convex portion 101a is provided on a bottom of the hook handle 101, and a toggle 101b (see FIG. 20), which extends forwards, is provided on the convex portion 101a; the hook handle 101 is hinged at a rear portion of the holder 107 through a second pin 110; the connector 106 is a hollow sleeve, convex blocks 106a are respectively provided at both sides of a rear portion of the connector 106, and a bolt 108 for fixing the main body 401 of the circuit board is provided at a side face of the connector 106; the connector 106 is coated on the inverted U-shaped portion 107d of the holder 107, and is fixed thereon by a limiting sheet 104 passing though the inverted U-shaped portion 107d; a chamber length of the connector 106 is longer than a length of the inverted U-shaped portion 107d with a difference of s; a reset elastic sheet 103 is provided between the connector 106 and the holder 107, in such a manner that the connector 106 is able to move forwards and backwards on the holder 107 within the difference s; the reset elastic sheet 103 has a U shape formed by front and rear elastic sheet portions 103b/103a; two elastic sheets 103 are respectively sleeved on the pin 110 and placed at both sides of the hook handle 101, wherein the front elastic sheet portion 103b is buckled on the convex block 107a of the holder, and the rear elastic sheet portion 103a is buckled on the convex block 106a of the connector 106; the hook button 102 is F-shaped, upper and lower hook 102a/102b are provided on a bottom portion of the hook button 102 and at a middle of the toggle 101b of the hook handle (see FIGS. 5 and 20); the lower hook 102b of the hook button 102 is buckled on the pin 110, and the upper hook 102a is buckled on the buckle 107c of the holder 107; a reset spring 111 of the hook button 102 is provided between the bottom portion of the hook button 102 and the hook handle 101; the hook handle 101 cooperates with the holder 107 through the hook button 102 for being attached to or detached from the holder; the toggle 101b cooperates with the transmission block 105a of the profile ratchet 105 for rotating the profile ratchet 105.

Figure 8:
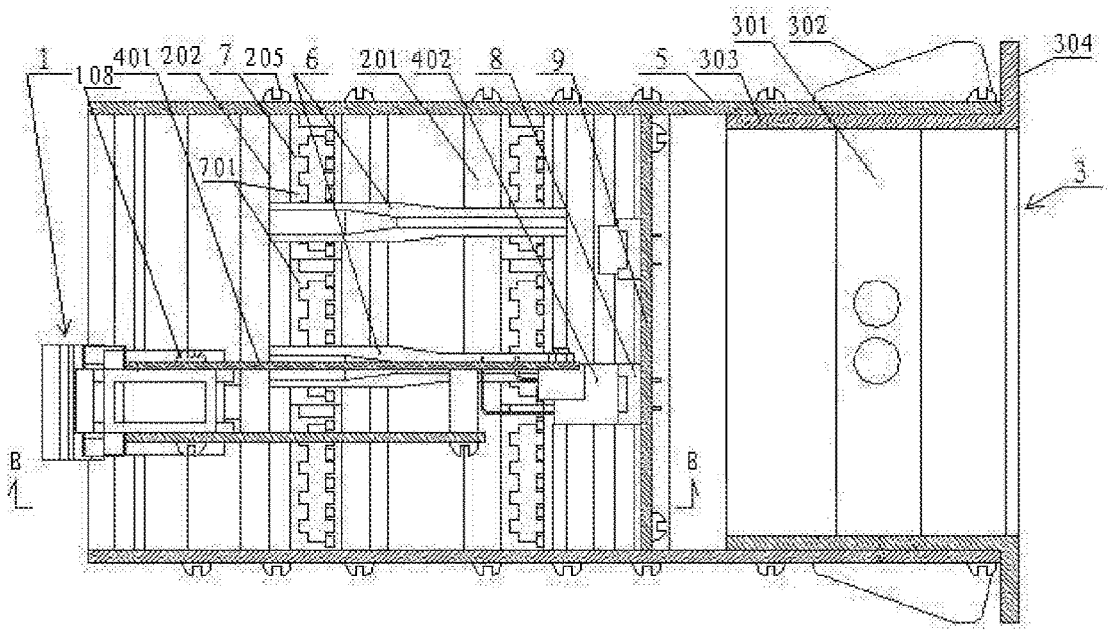
FIG. 8 is a cross sectional view of FIG. 1.
Figure 9:
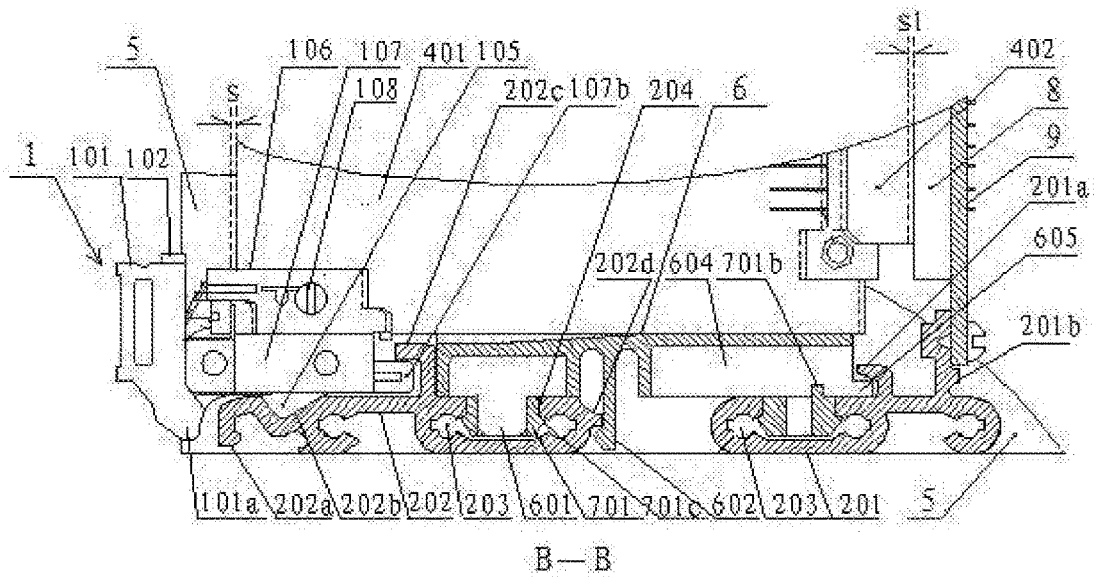
FIG. 9 is a BB sectional view of FIG. 8.

The circuit board secure connection apparatus 1 is mounted on the main body 401 of the circuit board 4 through the connector 106 by the bolt 108 (see FIGS. 8-9).

Referring to FIGS. 8-9, the crossbeam 2 of the box is made of section steel, comprising: a middle crossbeam part 201 and a rear crossbeam part 202 provided symmetrically, wherein a buckle limiter 201a and a fixing base 201b for fixing a computer bus board 9 are provided on the middle crossbeam part 201; an outside buckle 202d is provided at a front side of the rear crossbeam part 202, a flange 202a is provided on a rear portion, a limiting slot 202b is provided at a top face of a rear portion, and a buckle limiter 202c is provided at a top face of a middle portion; opened slots 204 are provided on front faces of both the middle crossbeam part 201 and the rear crossbeam part 202, a screw hold 203 corresponding to the screw bolt 205 is drilled on side faces; rail holders 7 are embedded in the opened slots 204, comprising multiple rail holder units 701; rails 6, cooperating with the main body 401 of the circuit board, are respectively provided on the middle crossbeam part 201 and the rear crossbeam part 202 through the rail holder 7; the rail holder units 701 are shown in FIGS. 10-13, wherein inserting holes 701a and limiting convex parts 701b, which are arranged alternatively and cooperate with the rails 6, are provided on the rail holder units 701, and convex blocks 701c are provided at both sides, which are coated on slot walls of the opened slots 204 of the middle crossbeam part 201 and the rear crossbeam part 202; the rails 6 are mounted on the middle crossbeam part 201 and the rear crossbeam part 202 though the rail holder units 701. Referring to FIGS. 14-17, the rails 6 are inverted U-shaped, with positioning slot 606 thereon for cooperating with the main body 401 of the circuit board 4; a horn-shaped socket 607 is provided at a front end of the positioning slot 606, a plug 605 extending forwards is provided at a rear end, and plugs 601 extending downwards and openings 603 are provided on bottom portions of two sides 604; a hook 602 is provided in the opening 603 at the bottom portion of the rail 6; the rails 6 cooperate with the buckle limiter 201a in the middle crossbeam part 201 and the inserting holes 701a on the rail holder units 701 through the plug 605 and the plugs 601; the hook 602 is connected to and fixed by the outside buckle 202d of the rear crossbeam part 202, and the two sides 604 of the rails 6 are simultaneously buckled between the limiting convex parts 701b of the rail holder units 701.

Figure 18:
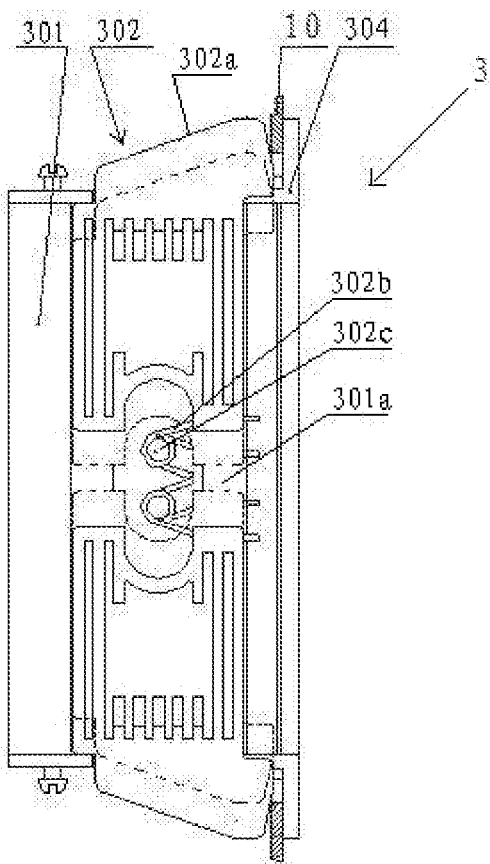
FIG. 18 is a sketch view of a hanging fixer of the present invention.

Referring to FIG. 18, the contact-fixing device 302 comprises a fixing sheet 302a with a bevel edge and a spring 302b, wherein the fixing sheet 302a is provided in a sliding slot 301a of the front crossbeam part 301, the spring 302b is mounted on the sliding slot 301a through a pin 302c, and one end of the spring 302b pushes against the fixing sheet 302a, in such a manner that the fixing sheet 302a is able to slide along the sliding slot 301a.

For different situations, conditions and numbers of the industrial computers, the present invention adapts combined rail holders for satisfying circuit board requirements of industrial computers of any type. During utilization, the rail holder 7 satisfying installation requirements of the circuit boards 4 is flexibly assembled with the rail holder units 701 according to the conditions, then the rails 6 is installed on the rail holder units 701. The main body 401 of the circuit board 4 is aimed at the horn-shaped socket 607 of the rail 6 and is pushed into the positioning slot 606, in such a manner that the plug 402 of the circuit board 4 is connected to the socket 8 of the computer bus board 9 in the box of the plug-and-lock industrial computer frame, until the ratchet teeth 105b of the profile ratchet 105 and the plug 107b in the circuit board secure connection apparatus 1 of the circuit board 4 are buckled in the limiting slot 202b and the buckle limiter 202c of the rear crossbeam part 202. Due to the rail holder 7 and the rails 6, intervals between the circuit boards 4 keep accurate. Furthermore, the circuit board secure connection apparatus 1 enables safe connection and buffing positioning of between the circuit boards 4 and the socket 8 in the industrial computer frame, wherein an interval between the elastic connector 106 and the holder 107 is within s, for continuously pressing the main body 401 of the circuit board 4, so as to form a flexible fixing method which eliminates installation errors s1 between the plug 8 and the socket 9. Therefore, connection between the plug 8 and the socket 9 is completely reliable, and the profile 105 enables a plug-and-lock feature of the circuit boards 4, which is simple, reliable and safe.

Figure 19:
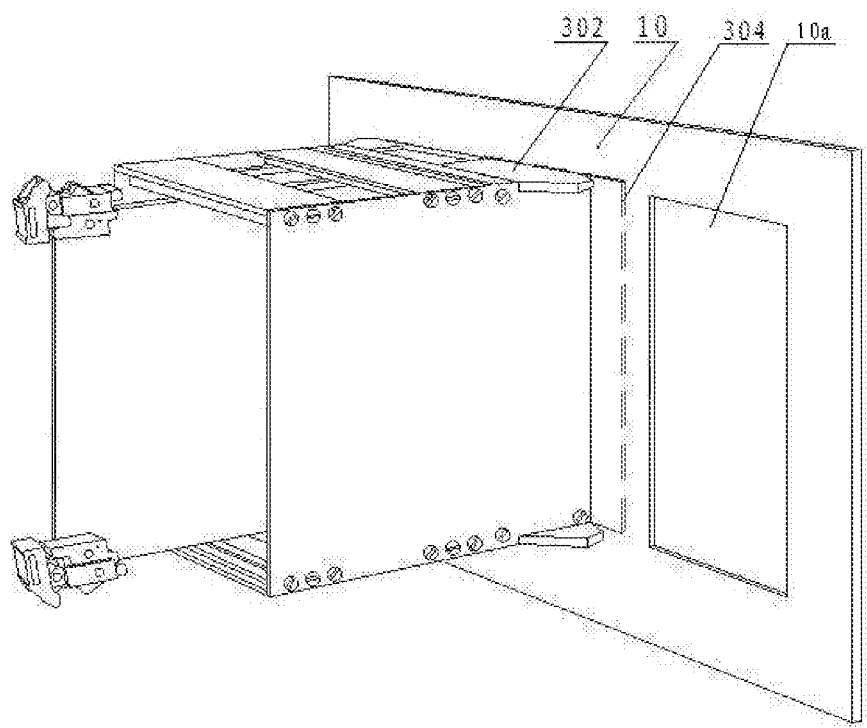
FIG. 19 is a sketch view of a utilization state of the present invention.

Referring to FIG. 19, during installation of the plug-and-lock industrial computer frame, the box is inserted into a box hole 10a of a cabinet panel 10. The elastic contact-fixing device 302 and the flange 304 of the hanging fixer 3 fix the box on the cabinet panel 10. Because the elastic contact-fixing device 302 is shrinkable, the industrial computer frame box is able to be rapidly attached to or detached from a cabinet, which simplifies debugging, maintenance, and replacement.

Figure 20:
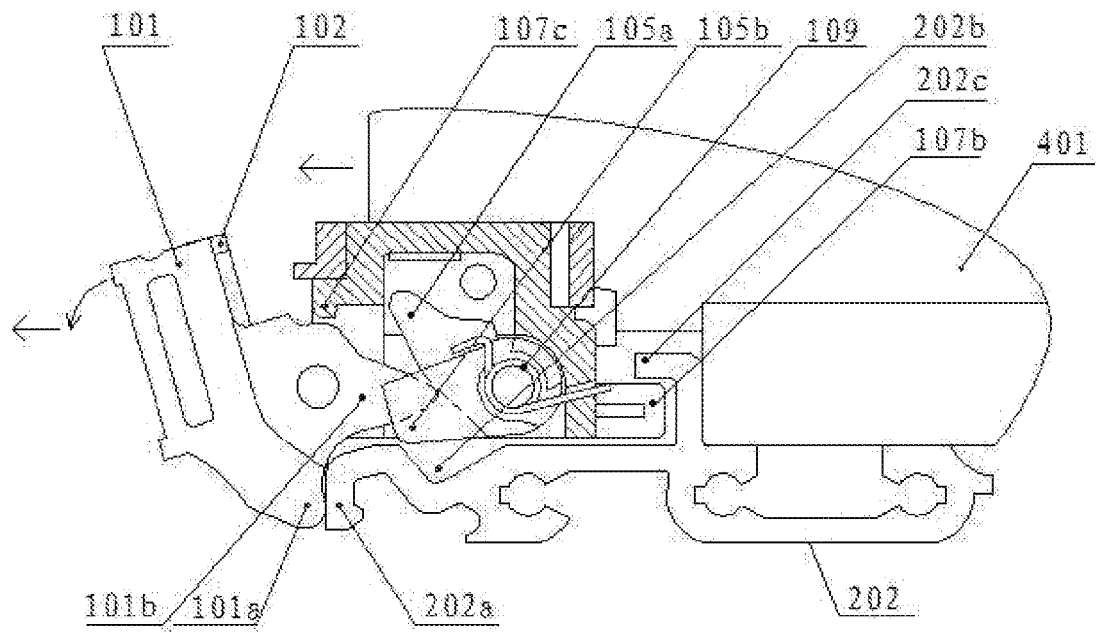
FIG. 20 is a sketch view of the circuit board under the utilization state of the present invention.
Figure 21:
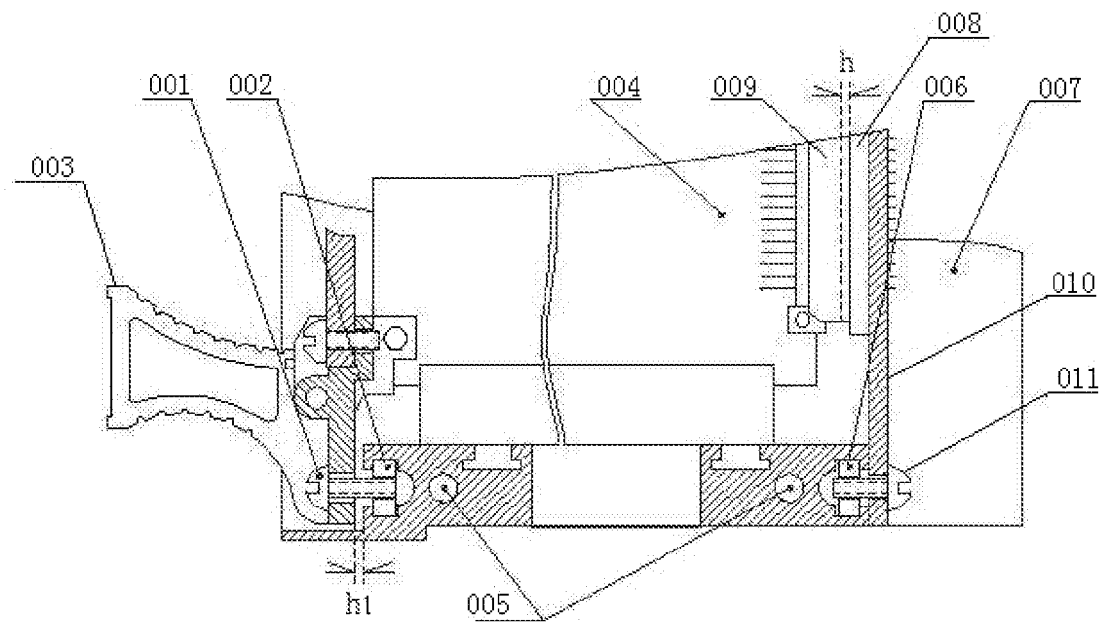
FIG. 21 is a sketch view of a conventional industrial computer.

Referring to FIG. 20, during uninstalling the circuit board 4, the hook button 102 is pushed for detaching from the holder 107 and releasing the hook handle 101, then the hook handle 101 is pushed downwards for pushing the ratchet teeth 105b of the profile ratchet 105 out of the limiting slot 202b of the rear crossbeam part 202 with the toggle 101b on the hook handle 101. The hook handle 101 is pulled backwards, in such a manner that the convex portion 101a at the bottom portion thereof pushes the flange 202a of the rear crossbeam part 202 as a lever for pulling the circuit board 4 out, thus achieving rapid detaching.

What is claimed is:

1. A circuit board secure connection apparatus, comprising: a holder; a connector which is elastic and movably mounted on the holder; a profile ratchet which is elastic and hinged on a bottom portion of the holder through a first hinge; a hook handle hinged on a rear portion of the holder through a second hinge; and a hook button which is elastic and movably mounted on the hook handle; wherein the hook handle cooperates with the holder through the hook button for being attached to or detached from the holder; the hook handle cooperates with the profile ratchet for rotating the profile ratchet; the profile ratchet and a reset spring are hinged to a front interlayer of the holder through a first pin;

wherein a plug and a buckle are provided on the holder; a hook on the hook button cooperates with the buckle on the holder, or two hooks on the hook button respectively cooperate with the buckle on the holder and the second hinge;

wherein a convex portion and a toggle are mounted on the hook handle; ratchet teeth and a transmission block are provided on the profile ratchet; the hook handle cooperates with the transmission block of the profile ratchet through the toggle;

wherein a reset elastic sheet is provided between the connector and the holder, in such a manner that the connector moves forwards and backwards on the holder within a certain range; the reset elastic sheet has a U shape formed by a front elastic sheet portion and a rear elastic sheet; two elastic sheets are respectively sleeved on the second hinge and placed at both sides of the hook handle, wherein the front elastic sheet portion is buckled on a convex block of the holder, and the rear elastic sheet portion is buckled on a convex block of the connector;

wherein an upper hook and a lower hook are provided on a bottom portion of the hook button and at a middle of the toggle of the hook handle; the lower hook of the hook button is buckled on the second hinge, and the upper hook is buckled on the buckle of the holder; a hook button spring is provided between the bottom portion of the hook button and the hook handle;

wherein a top portion of the holder is an inverted U-shaped portion; the connector is coated on the inverted U-shaped portion of the holder, and is fixed thereon by a limiting sheet passing though the inverted U-shaped portion.

2. The circuit board secure connection apparatus, as recited in claim 1, wherein the connector is sleeved on the holder with an interval, an elastic part is provided between the holder and the connector.

3. A circuit board with a circuit board secure connection apparatus, comprising: a main body with a body plug; wherein the circuit board secure connection apparatus is provided on the main body, and is mounted on the main body through a connector;

wherein the circuit board secure connection apparatus comprises: a holder; a connector which is elastic and movably mounted on the holder; a profile ratchet which is elastic and hinged on a bottom portion of the holder through a first hinge; a hook handle hinged on a rear portion of the holder through a second hinge; and a hook button which is elastic and movably mounted on the hook handle; wherein the hook handle cooperates with the holder through the hook button for being attached to or detached from the holder; the hook handle cooperates with the profile ratchet for rotating the profile ratchet; the profile ratchet and a reset spring are hinged to a front interlayer of the holder through a pin.

4. The circuit board, as recited in claim 3, wherein the circuit board secure connection apparatus is symmetrically provided on a rear portion of the main body.

* * * * *